(12) United States Patent
Yen et al.

(10) Patent No.: US 10,692,966 B2
(45) Date of Patent: Jun. 23, 2020

(54) DEEP TRENCH CAPACITOR WITH SCALLOP PROFILE

(71) Applicant: Taiwan Semiconductor Manufacturing Co., Ltd., Hsin-Chu (TW)

(72) Inventors: Tsui-Ling Yen, Zhubei (TW); Chyi-Tsong Ni, Hsin-Chu (TW); Ruei-Hung Jang, Jhubei (TW); Bpin Lo, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/126,123

(22) Filed: Sep. 10, 2018

(65) Prior Publication Data

US 2019/0019860 A1    Jan. 17, 2019

Related U.S. Application Data

(62) Division of application No. 15/356,859, filed on Nov. 21, 2016.

(Continued)

(51) Int. Cl.
*H01L 29/66* (2006.01)
*H01L 49/02* (2006.01)
(Continued)

(52) U.S. Cl.
CPC ............ *H01L 28/60* (2013.01); *H01L 23/535* (2013.01); *H01L 28/87* (2013.01); *H01L 28/91* (2013.01);
(Continued)

(58) Field of Classification Search
CPC .... H01L 28/60; H01L 28/82; H01L 29/66181
See application file for complete search history.

(56) References Cited

U.S. PATENT DOCUMENTS 4,853,348 A    8/1989  Tsubouchi
4,906,590 A *  3/1990  Kanetaki ............ H01L 21/0274
                                                    257/304

(Continued)

FOREIGN PATENT DOCUMENTS

JP       2000164825 A    6/2000
KR      20010081778 A    8/2001
TW        201222778 A    6/2012

OTHER PUBLICATIONS

Non-Final Office Action dated Oct. 20, 2017 for U.S. Appl. No. 15/356,859.

(Continued)

*Primary Examiner* — Cuong Q Nguyen
*Assistant Examiner* — Shih Tsun A Chou
(74) *Attorney, Agent, or Firm* — Eschweiler & Potashnik, LLC

(57) ABSTRACT

The present disclosure relates to a method of forming a deep trench capacitor. In some embodiments, the method may be performed by selectively etching a substrate to form a trench having serrated sidewalls defining a plurality of curved depressions. A dielectric material is formed within the trench. The dielectric material conformally lines the serrated sidewalls. A conductive material is deposited within the trench and is separated from the substrate by the dielectric material. The dielectric material is configured to act as a capacitor dielectric between a first electrode comprising the conductive material and a second electrode arranged within the substrate.

20 Claims, 8 Drawing Sheets

Related U.S. Application Data

(60) Provisional application No. 62/272,220, filed on Dec. 29, 2015.

(51) Int. Cl.
 *H01L 29/94* (2006.01)
 *H01L 23/535* (2006.01)
 *H01L 29/06* (2006.01)
 *H01L 29/32* (2006.01)

(52) U.S. Cl.
 CPC .......... *H01L 29/0649* (2013.01); *H01L 29/32* (2013.01); *H01L 29/66181* (2013.01); *H01L 29/945* (2013.01)

(56) References Cited

U.S. PATENT DOCUMENTS

| | | | |
|---|---|---|---|
| 5,501,893 A * | 3/1996 | Laermer | H01L 21/3065 216/67 |
| 5,592,412 A | 1/1997 | Kleinhenz et al. | |
| 5,663,085 A | 9/1997 | Tanigawa | |
| 5,696,014 A | 12/1997 | Figura | |
| 5,877,061 A | 3/1999 | Halle et al. | |
| 5,932,333 A | 8/1999 | Lee | |
| 6,004,859 A | 12/1999 | Lin | |
| 6,025,225 A | 2/2000 | Forbes et al. | |
| 6,177,696 B1 | 1/2001 | Bronner et al. | |
| 6,271,079 B1 | 8/2001 | Wei | |
| 6,387,773 B1 * | 5/2002 | Engelhardt | H01L 27/1087 438/243 |
| 6,448,131 B1 | 9/2002 | Carbral, Jr. | |
| 6,495,411 B1 | 12/2002 | Mei | |
| 6,620,675 B2 | 9/2003 | Furukawa et al. | |
| 6,696,344 B1 | 2/2004 | Lin | |
| 6,806,138 B1 | 10/2004 | Cheng et al. | |
| 8,049,327 B2 * | 11/2011 | Kuo | H01L 21/76898 257/621 |
| 10,120,134 B2 * | 11/2018 | Saadany | G02B 6/136 |
| 2003/0052088 A1 | 3/2003 | Khan et al. | |
| 2003/0064591 A1 | 4/2003 | Lutzen et al. | |
| 2003/0068867 A1 | 4/2003 | Forster et al. | |
| 2003/0143802 A1 * | 7/2003 | Chen | H01L 27/1087 438/243 |
| 2003/0205483 A1 * | 11/2003 | Birner | C25F 3/12 205/640 |
| 2004/0188739 A1 | 9/2004 | Takenaka et al. | |
| 2005/0118775 A1 * | 6/2005 | Goldbach | H01L 27/10867 438/386 |
| 2008/0122030 A1 | 5/2008 | Cheng et al. | |
| 2010/0258904 A1 | 10/2010 | Li et al. | |
| 2011/0272702 A1 | 11/2011 | Kwon et al. | |
| 2012/0199949 A1 | 8/2012 | Lan et al. | |
| 2013/0161792 A1 | 6/2013 | Tran et al. | |
| 2014/0159197 A1 | 6/2014 | Weng et al. | |
| 2015/0076657 A1 | 3/2015 | Chou et al. | |

OTHER PUBLICATIONS

Final Office Action dated Apr. 6, 2018 for U.S. Appl. No. 15/356,859.
Non-Final Office Action dated Aug. 10, 2018 for U.S. Appl. No. 15/356,859.
Andrew R. Neureuther, Simulation of Semiconductor Lithography and Topology, 2006, pp. 87-88.
Final Office Action dated Feb. 26, 2019 for U.S. Appl. No. 15/356,859.

* cited by examiner

DEEP TRENCH CAPACITOR WITH SCALLOP PROFILE

REFERENCE TO RELATED APPLICATIONS

This application is a Divisional of U.S. application Ser. No. 15/356,859 filed on Nov. 21, 2016, which claims priority to U.S. Provisional Application No. 62/272,220 filed on Dec. 29, 2015. The contents of the above-referenced applications are hereby incorporated by reference in their entirety.

BACKGROUND

The semiconductor industry has continually tried to decrease the surface area of semiconductor devices to fit more devices on a same substrate size. Vertical device structures can greatly reduce the surface area requirement for a semiconductor device. One type of vertical device that is commonly implemented in integrated chips is deep trench capacitors. Deep trench capacitors comprise one or more capacitor electrodes that extend into a trench within a semiconductor substrate. They can be used for a myriad of purposes, such as decoupling capacitors that are configured to decouple one part of an electrical circuit, such as interconnect, from another part of the circuit, for example.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
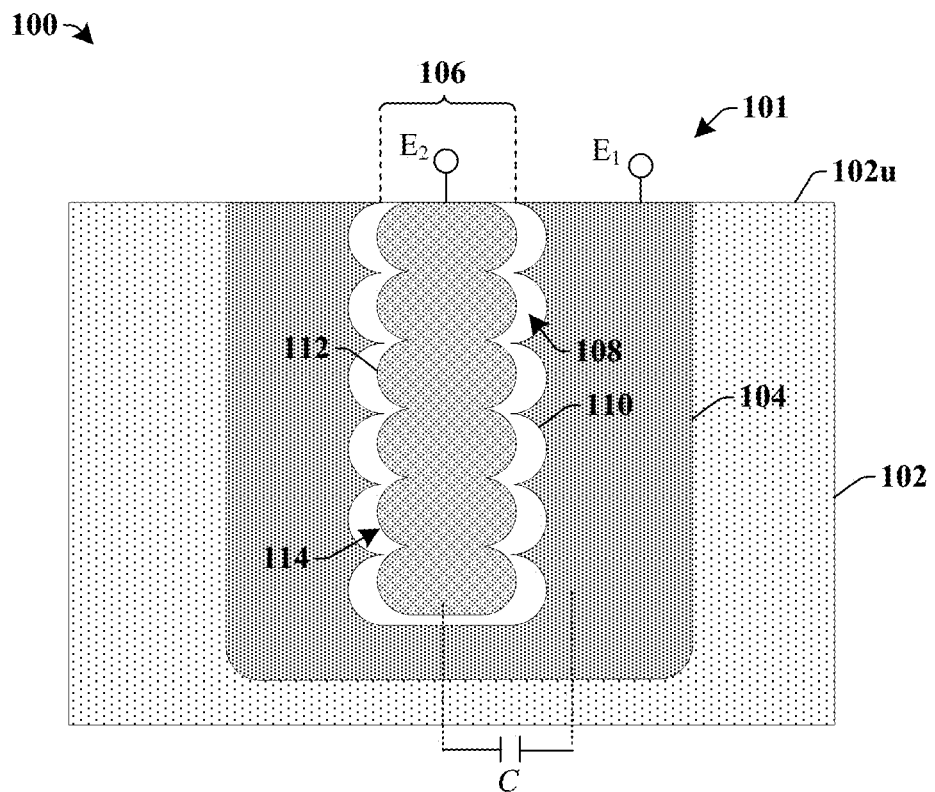
FIG. 1 illustrates a cross-sectional view of some embodiments of an integrated chip having a deep trench capacitor within a trench comprising serrated sidewalls defining a plurality of curved depressions.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Deep trench capacitors are capacitors that are formed within trenches extending into a semiconductor substrate. Typically, deep trench capacitors are formed by etching the substrate to form a trench, into which a conductive material and a dielectric material are subsequently formed. As the size of integrated chip components decreases, the depth of the deep trenches can cause a number of issues. For example, in multi-tiered three-dimensional integrated chip (3DIC) substrates are often thinned prior to bonding. However, deep trenches may inhibit substrate thinning, thereby increasing the length of inter-tier interconnections between stacked substrates. Furthermore, while the vertical sidewalls of deep trench capacitors allow for the capacitors to scale well, as the distance between the capacitors decreases it results in a weak structural integrity of the substrate along the edge due to decreasing silicon density. The decreased structural integrity can lead to integrated chip failure, which is costly to integrated chip manufacturers.

The present disclosure relates to an integrated chip having a deep trench capacitor arranged within a trench having serrated sidewalls defining a plurality of curved depressions, and a method of formation. The curved depressions increase a surface area of capacitive electrodes of a deep trench capacitor within the trench, thereby allowing for the capacitor to have a greater capacitance per unit depth. In some embodiments, the integrated chip comprises a substrate having a trench with serrated sidewalls defining a plurality of curved depressions. A layer of dielectric material conformally lines the serrated sidewalls, and a layer of conductive material is arranged within the trench and is separated from the substrate by the layer of dielectric material. The layer of dielectric material is configured as a capacitor dielectric between a first electrode comprising the layer of conductive material and a second electrode arranged within the substrate.

FIG. 1 illustrates a cross-sectional view of some embodiments of an integrated chip 100 having a deep trench capacitor 101 arranged within a trench comprising serrated sidewalls defining a plurality of curved depressions.

The integrated chip 100 comprises a substrate 102 having a conductive doped region 104. In some embodiments, the substrate 102 comprises a semiconductor material (e.g., silicon) having a first doping type (e.g., n-type). The conductive doped region 104 may have a second doping type (e.g., p-type) that is different than the first doping type. Capacitor components are disposed in a trench 106 that extends from an upper surface 102u of the substrate 102 to an underlying location within the conductive doped region 104. The trench 106 has serrated sidewalls that respectively define a plurality of curved depressions 108.

Capacitor components may include a layer of dielectric material 110 is arranged within the trench 106. In some embodiments, the layer of dielectric material 110 may conformally line the serrated sidewalls of the trench 106. Conductive material 112 is also arranged within the trench 106. The conductive material 112 has sidewalls comprising a plurality of curved protrusions 114 facing the serrated sidewalls of the trench 106. In some embodiments, the conductive material 112 is vertically and laterally separated from the substrate 102 by the layer of dielectric material 110.

In some embodiments, the conductive doped region 104 is configured to act as a first capacitor electrode ($E_1$) of a deep trench capacitor 101. The conductive material 112 is configured to act as a second capacitor electrode ($E_2$), which is separated from the first electrode ($E_1$) by the layer of dielectric material 110 to give the deep trench capacitor 101 a capacitance C. Since the capacitance C is based upon charges on the first capacitor electrode ($E_1$) and the second capacitor electrode ($E_2$), the capacitance C is proportional a surface area of interior surfaces of the trench 106 and a surface area of exterior surfaces of the conductive material 112. The serrated sidewalls of the trench 106 and the conductive material 112 increase a surface area of the interior surfaces of the trench 106 and the exterior surfaces of the conductive material 112, thereby increasing a capacitance of the deep trench capacitor 101 per unit of depth. In other words, the serrated sidewalls allow for the deep trench capacitor 101 to have a same capacitance as a capacitor having smooth sidewalls at a lesser depth. By reducing the depth of the trench 106, the deep trench capacitor 101 can be formed in a shorter time and can be easily integrated into multi-tiered 3DIC structures.

Figure 2:
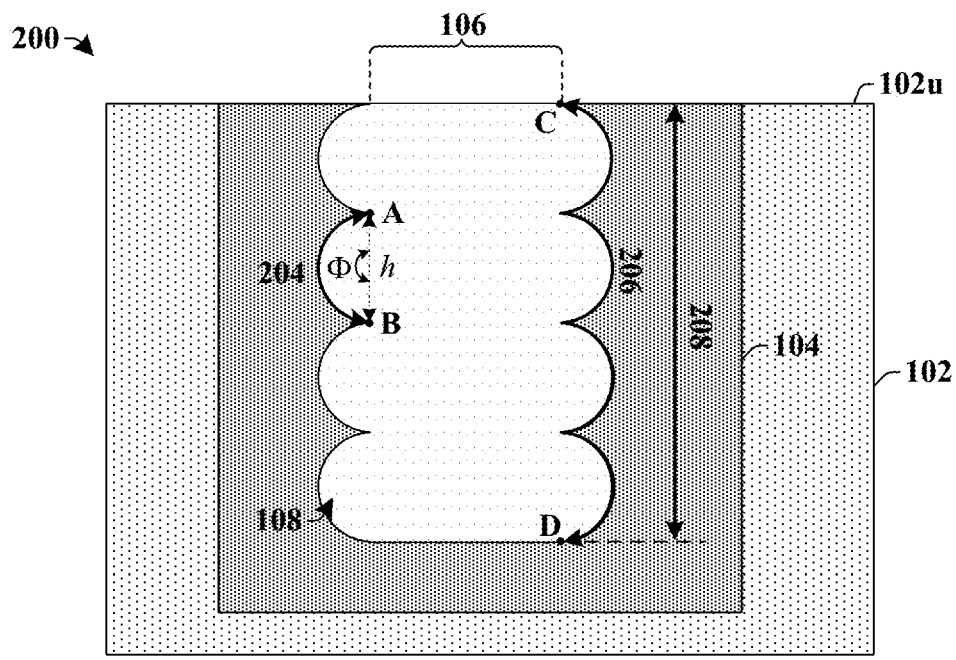
FIG. 2 illustrates a cross-sectional view of some additional embodiments of an integrated chip having a deep trench capacitor within a trench having serrated sidewalls.

FIG. 2 illustrates a cross-sectional view of some additional embodiments of an integrated chip 200 having a trench comprising serrated sidewalls.

The integrated chip 200 comprises a trench 106 that extends from an upper surface 102u of a substrate 102 to an underlying position within the substrate 102. The trench 106 comprises serrated sidewalls defining a plurality of curved depressions 108. In some embodiments, the plurality of curved depressions 108 may comprise arced depressions having substantially arced cross-sections within the sidewall of the trench 106. The arced depressions have a surface area that is proportional to lengths of the arced depressions, so that an arced depression that has an interior surface with an arc length spanning an angle of Φ will have a length 204 that is equal to Φ/360° *h*3.14. For example, a semi-circular arced depression with a height h and an arc length spanning 180° (i.e., a half circle) will have a length 204 (extending along a side of the trench 106 between points A and B) that is equal to 180°/360°*h*3.14=1.57*h.

The curved depressions 108 within the serrated sidewalls increase a sidewall length along a cross-section of the substrate 102 relative to straight sidewalls. For example, for arced depressions comprising semicircular arced depressions a sidewall of the trench 106 will have a length 206 (between points C and D) that is equal to 1.57 times a depth 208 of the trench 106 (e.g., allowing for a disclosed deep trench capacitor having a trench 106 with a depth 208 of approximately 19 um to provide for a same capacitance as a deep trench capacitor with straight trench sidewalls having a depth of approximately 30 um). The increased length 206 increases a capacitance of a deep trench capacitor formed within the trench 106, since the capacitance is defined as: $C=\varepsilon_r\varepsilon_0 \cdot A/d$, where A is an area of overlap of capacitor electrodes, $\varepsilon_r$ is the relative static permittivity of a dielectric material between the capacitor electrodes, $\varepsilon_0$ is the permittivity of free space ($\varepsilon_0 \approx 8.854 \times 10^{-12}$ F m$^{-1}$), and d is the distance separating the capacitor electrodes. Thus, the serrated sidewalls allow for a disclosed deep trench capacitor formed within the trench 106 to have a capacitance equal to a capacitor within a trench having straight sidewalls at a smaller trench depth.

Figure 3:
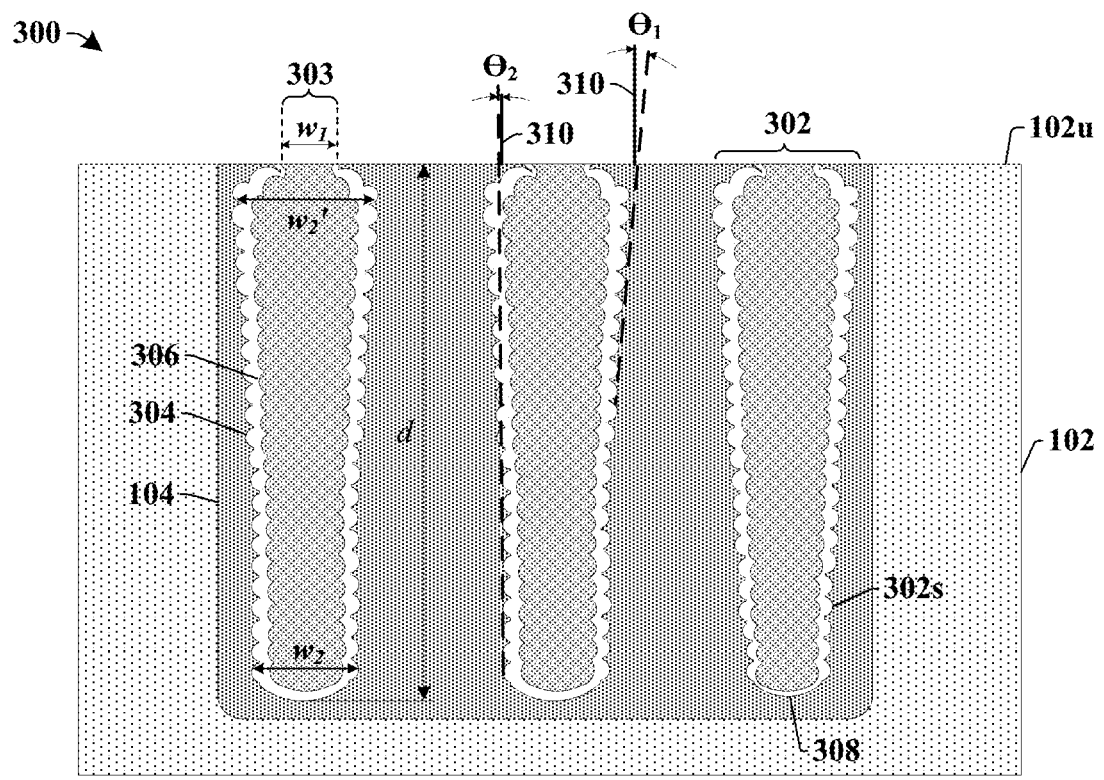
FIG. 3 illustrates a cross-sectional view of some additional embodiments of an integrated chip having a deep trench capacitor within a trench having serrated sidewalls.

FIG. 3 illustrates a cross-sectional view of some additional embodiments of an integrated chip 300 having a deep trench capacitor within a trench comprising serrated sidewalls.

The integrated chip 300 comprises a plurality of trenches 302 respectively extending from an upper surface 102u of a substrate 102 to an underlying location within the substrate 102. In some embodiments, the plurality of trenches 302 may be arranged within a conductive doped region 104. In such embodiments, a layer of dielectric material 304 is arranged within the plurality of trenches 302, and a layer of conductive material 306 is arranged within the plurality of trenches 302 at locations separated from the substrate 102 by the layer of dielectric material 304.

The one or more trenches 302 comprise sidewalls 302s defining a plurality of curved depressions. In some embodiments, the one or more trenches 302 also have a bottom surface 308 comprising a curved profile. The one or more trenches 302 respectively define an opening 303 that is arranged along the upper surface 102u of the substrate 102 and an underlying cavity in communication with the opening 303. The cavity has a width, extending between opposing sidewalls 302s, which generally increases (e.g., from $w_2$ to $w_2'$) as a distance from the upper surface 102u of the substrate 102 decreases. In some embodiments, the one or more trenches 302 curve inward along top portion thereof (e.g., toward the opening 303), so that the opening 303 has a first width $w_1$, while the underlying cavity has second width, $w_2$ or $w_2'$, that is larger than the first width $w_1$. The curvature of a trench causes the trench to protrude laterally outward from the opening 303, so that the substrate 102 overhangs the trench along opposing sides.

In some embodiments, the first width $w_1$ of the opening 303 is smaller than the smallest width of the underlying cavity (i.e., $w_1 < w_2 < w_2'$). In some embodiments, the width $w_2'$ may be in a range of between approximately ⅙$^{th}$ and approximately to ⅐$^{th}$ a depth d of the one or more trenches 302 (e.g., for a trench with a depth d of 19 um, $w_2'$ may be in a range of between approximately 2.5 um and approximately 3.5 um). In some embodiments, the width $w_2$ may be in a range of between approximately ⅛$^{th}$ and approximately to ⅑$^{th}$ the depth d of the one or more trenches 302 (e.g., for a trench with a depth d of 19 um, $w_2$ may be in a range of between approximately 2.0 and approximately 3.0 um). In some embodiments, the width $w_1$ may be in a range of between approximately 1/11$^{th}$ and approximately to 1/12$^{th}$ the depth d of the one or more trenches 302 (e.g., for a trench with a depth d of 19 um, $w_1$ may be in a range of between approximately 1.5 um and approximately 2.5 um).

In some embodiments, the sidewalls 302s of the one or more trenches 302 are angled with respect to a normal line 310 that is perpendicular to the upper surface 102u of the substrate 102. In some embodiments, sidewall angles of the sidewalls 302s change along a depth d of a trench. In some embodiments, the sidewall angles (with respect to normal line 310) of the sidewalls 302s decrease as depths of the one or more trenches 302 increase. For example, in some embodiments, upper sections of the sidewalls 302s are angled at a first angle $\Theta_1$ with respect to the normal line 310 and lower sections of the sidewalls 302s are angled at a second angle $\Theta_2$ with respect to the normal line 310, wherein the second angle $\Theta_2$ is smaller than the first angle $\Theta_1$.

Although integrated chip 300 is illustrated as having a capacitor with an electrode comprising the conductive doped region 104, it will be appreciated that in alternative embodiments the conductive doped region 104 may be omitted. For example, in some alternative embodiments, the plurality of trenches 302 may not be arranged within a conductive doped region. In such embodiments, two or more layers of conductive material may be arranged within respectively ones of the plurality of trenches 302. The two or more layers of conductive material are separated by one or more layers of dielectric material and are configured to act as capacitor electrodes.

Figure 4A:
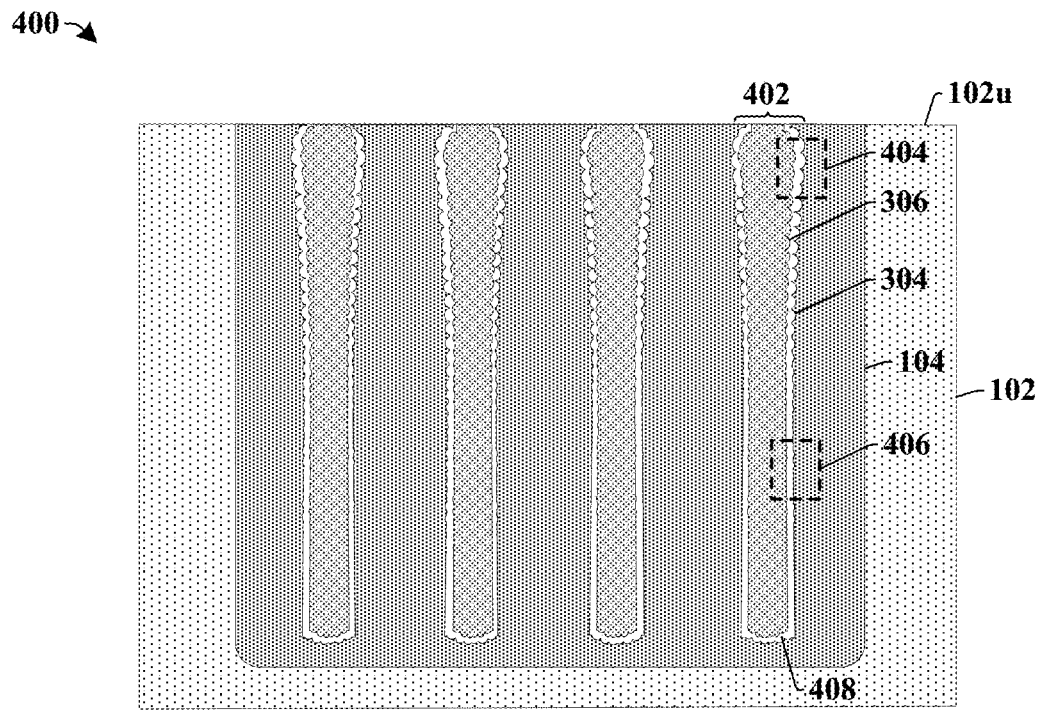
FIGS. 4A-4C illustrate cross-sectional views of some additional embodiments of an integrated chip having a deep trench capacitor within a trench having serrated interior surfaces.
Figure 4B:
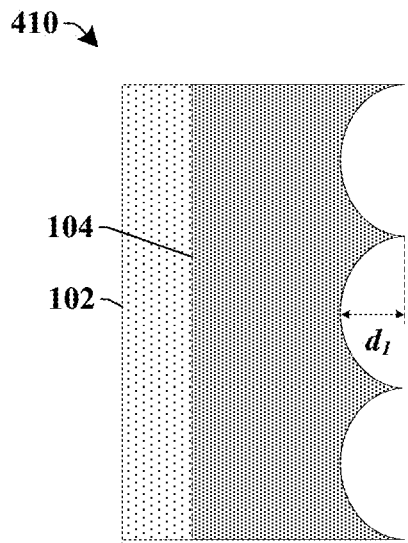
Figure 4C:
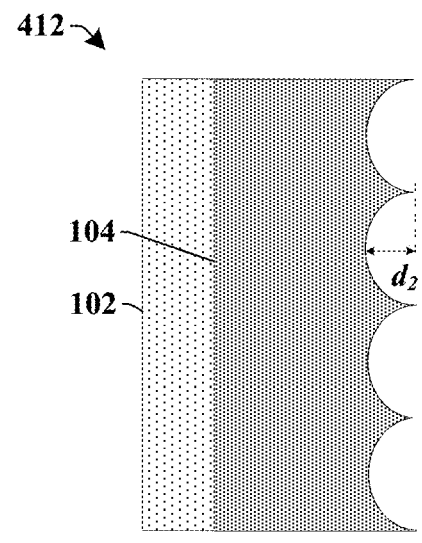

FIGS. 4A-4C illustrate cross-sectional views of some additional embodiments of an integrated chip 400 having a deep trench capacitor within a trench comprising serrated interior surfaces.

The integrated chip 400 comprises a plurality of trenches 402 extending into a substrate 102. The plurality of trenches 402 comprise serrated interior surfaces defining a plurality of curved depressions. In some embodiments, the serrated interior surfaces may comprise serrated sidewalls. In some embodiment, the serrated interior surfaces may also comprise a bottom surface 408 having a curved profile extending between opposing sidewalls of a trench, which defines a plurality of curved depressions (e.g., arced depressions). The curved depressions along the bottom surface 408 of the plurality of trenches 402 further increase a surface area of interior surfaces of a trench and a surface area of exterior surfaces of a conductive material 306 within the trench.

In some embodiments, the plurality of curved depressions may have a non-uniform depth along a depth of a trench. For example, in some embodiments, the depths of the plurality of curved depressions into the substrate 102 may decrease as a distance from an upper surface 102u of the substrate 102 increases. For example, in a first section 404, which is shown in FIG. 4A and also in cross-sectional view 410 of FIG. 4B, the curved depressions may have a first depth of $d_1$. In a second section 406 that is below the first section 404 (i.e., that is further from the upper surface 102u than the first section 404), the curved depressions may have a second depth of $d_2$, as shown in FIG. 4A and in cross-sectional view 412 of FIG. 4C. The second depth $d_2$ is less than the first depth $d_1$. For example, in some embodiments, the first depth $d_1$ may be in a range of between approximately 100 nm and approximately 500 nm, while the second depth $d_2$ may be in a range of between approximately 0 nm and approximately 200 nm.

In some embodiments, as the depths of the curved depressions into the substrate 102 decrease, a slope of the serrated sidewalls of the plurality of trenches 402 increase (i.e., as a depth of the depressions decreases, the sidewall angle of the serrated sidewalls with respect to a normal line perpendicular to the upper surface 102u decreases).

Figure 5:
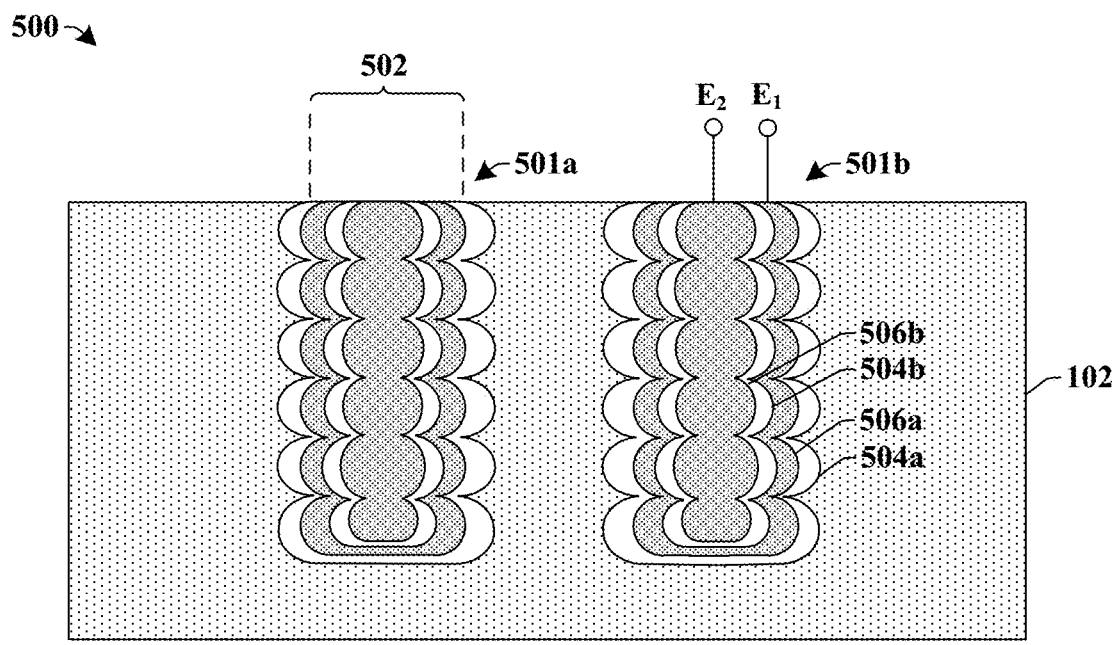
FIGS. 5-7 illustrate a cross-sectional view of some additional embodiments of an integrated chip having a deep trench capacitor within a trench having serrated interior surfaces.

FIG. 5 illustrates a cross-sectional view of some additional embodiments of an integrated chip 500 having one or more deep trench capacitors within a trench comprising serrated interior surfaces.

The integrated chip 500 comprises a plurality of trenches 502 arranged within a substrate 102 and having serrated sidewalls defining a plurality of curved depressions. A first layer of dielectric material 504a is conformally arranged along the serrated sidewalls of the plurality of trenches 502. A first layer of conductive material 506a is conformally arranged along interior sidewalls of the first layer of dielectric material 504a, so that the first layer of dielectric material 504a separates the first layer of conductive material 506a from the substrate 102. A second layer of dielectric material 504b is conformally arranged along interior surfaces of the first layer of conductive material 506a. A second layer of conductive material 506b is conformally arranged along interior sidewalls of the second layer of dielectric material 504b, so that the second layer of dielectric material 504b separates the first layer of conductive material 506a from the second layer of conductive material 506b.

In some embodiments, the integrated chip 500 comprises a first deep trench capacitor 501a and a second deep trench capacitor 501b. The deep trench capacitors, 501a and 501b, respectively have a first electrode $E_1$ comprising the first layer of conductive material 506a, a second electrode $E_2$ comprising the second layer of conductive material 506b, and an intervening capacitor dielectric comprising the second layer of dielectric material 504b. In some embodiments, the first layer of dielectric material 504a may be omitted.

Figure 6:
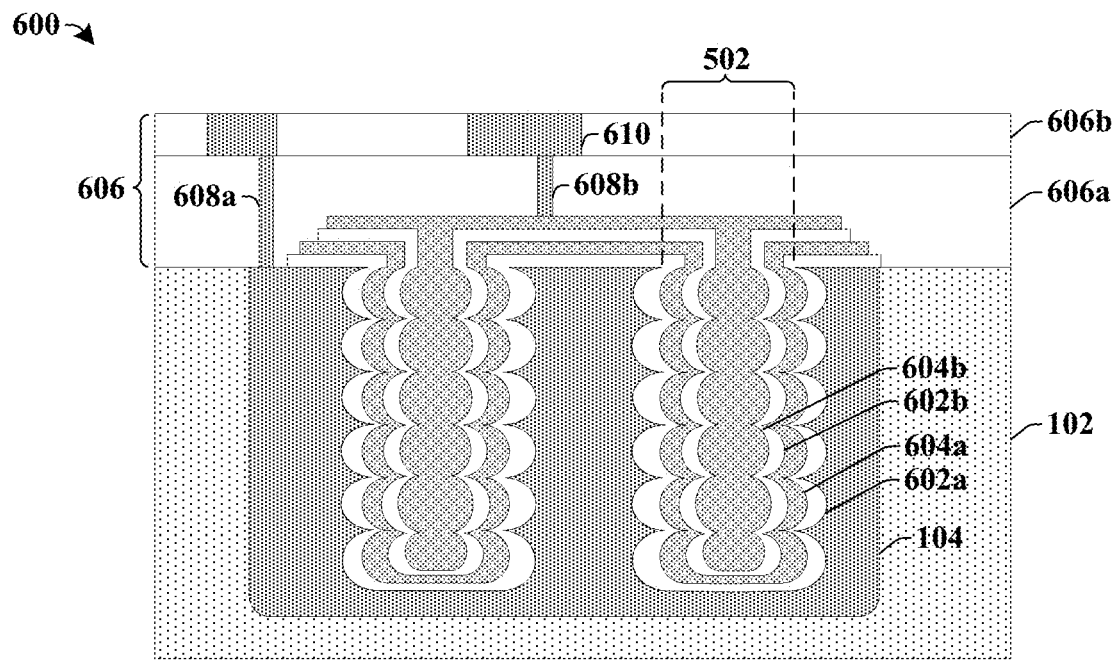

FIG. 6 illustrates a cross-sectional view of some additional embodiments of an integrated chip 600 having deep trench capacitors within trenches comprising serrated interior surfaces.

The integrated chip 600 comprises a plurality of trenches 502 having serrated sidewalls defining a plurality of curved depressions which extend into a conductive doped region 104. A first layer of dielectric material 602a is conformally arranged along the serrated sidewalls of the plurality of trenches 502, and extends outward from the plurality of trenches 502 to locations overlying the substrate 102. A first layer of conductive material 604a is conformally arranged along interior sidewalls of the first layer of dielectric material 602a, so that the first layer of dielectric material 602a separates the first layer of conductive material 604a from the substrate 102. The first layer of conductive material 604a also extends outward from the plurality of trenches 502 to locations overlying the substrate 102 and the first layer of dielectric material 602a.

In some embodiments, a second layer of dielectric material 602b is conformally arranged along interior sidewalls of the first layer of conductive material 604a, and extends outward from the plurality of trenches 502 to locations overlying the substrate 102. A second layer of conductive material 604b is conformally arranged along interior sidewalls of the second layer of dielectric material 602b, so that the second layer of dielectric material 602b separates the second layer of conductive material 604b from the first layer of conductive material 604a. The second layer of conductive material 604b also extends outward from the plurality of trenches 502 to locations overlying the substrate 102.

A back-end-of-the-line (BEOL) metallization stack is arranged over the substrate 102. The BEOL metallization stack comprises a plurality of metal interconnect layers arranged within a dielectric structure 606 having one or more inter-level dielectric (ILD) layer 606a-606b. In various embodiments, the one or more ILD layers 606a-606b may comprise an oxide, an ultra-low k dielectric material, and/or a low-k dielectric material (e.g., SiCO). In some embodiments, the plurality of metal interconnect layers may comprise a first conductive contact 608a and a second conductive contact 608b arranged within a first ILD layer 606a. The first conductive contact 608a is electrically coupled to the conductive doped region 104 and the second conductive contact 608b is electrically coupled to the second layer of conductive material 604b, thereby forming two deep trench capacitors arranged in a series connection. The plurality of metal interconnect layers further comprise metal interconnect wires 610 arranged within a second ILD layer 606b and electrically coupled to one or more of the conductive contacts 608a-608c. In other embodiments, additional contacts may be arranged within the first ILD layer 606a to form alternative connection types (e.g., parallel connections, decoupled capacitors, etc.).

Figure 7:
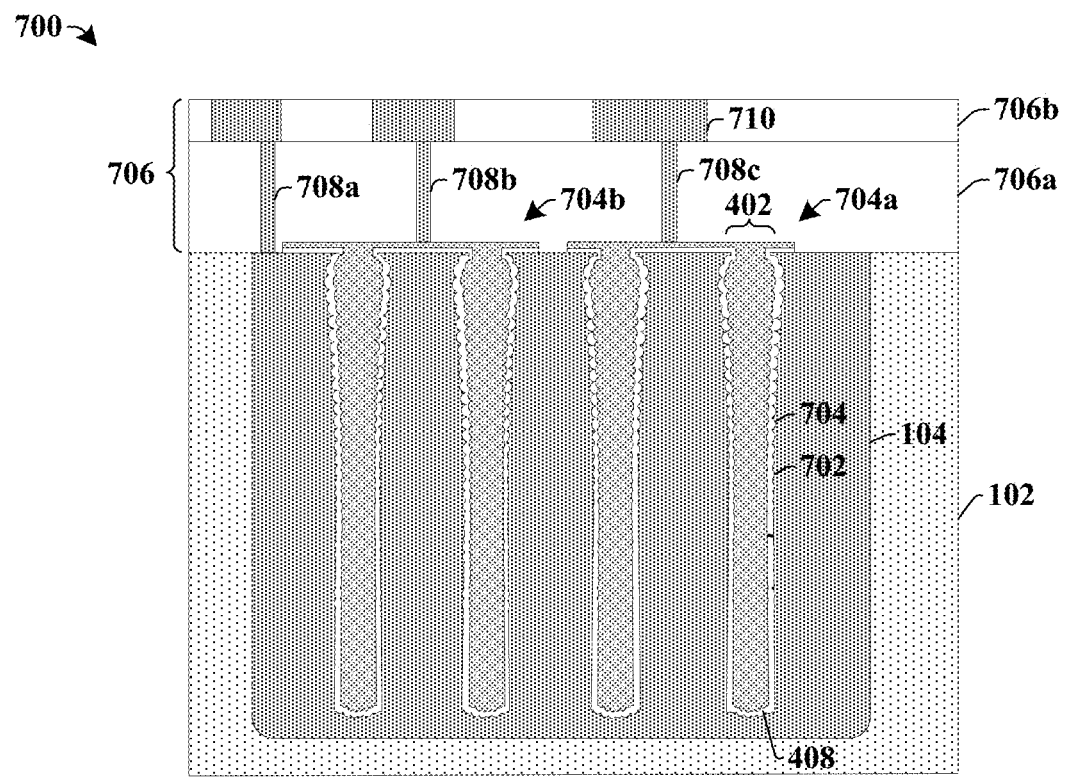

FIG. 7 illustrates a cross-sectional view of some additional embodiments of an integrated chip 700 having deep trench capacitors within trenches comprising serrated interior surfaces.

The integrated chip 700 comprises a plurality of trenches 402 within a substrate 102, which have serrated sidewalls defining a plurality of curved depressions. A layer of dielectric material 702 is conformally arranged along the serrated sidewalls. The layer of dielectric material 702 extends outward from the plurality of trenches 402 to location overlying the substrate 102. A layer of conductive material 704 is conformally arranged along interior sidewalls of the layer of dielectric material 702, so that the layer of dielectric material 702 separates the layer of conductive material 704 from the substrate 102. The layer of conductive material 704 also extends outward from the plurality of trenches 402 to locations overlying the substrate 102 and the layer of dielectric material 702.

A plurality of metal interconnect layers are arranged within a dielectric structure 706 over the substrate 102. The plurality of metal interconnect layers comprise conductive contacts 708a-708c arranged within a first ILD layer 706a and metal interconnect wires 710 arranged within a second ILD layer 706b over the first ILD layer 706a. In some embodiments, the layer of conductive material 704 over the substrate 102 is laterally separated by the dielectric structure 706 to form a first segment of conductive material 704a and a second segment of conductive material 704b. In some such embodiments, a first conductive contact 708a is electrically coupled to conductive doped region 104, a second conductive contact 708b is electrically coupled to the first segment of conductive material 704a, and a third conductive contact 708c is electrically coupled to the second segment of conductive material 704b, thereby forming two deep trench capacitors arranged in a parallel connection. In other embodiments, additional contacts may be arranged within the first ILD layer 706a to form alternative connection types (e.g., series connections, decoupled capacitors, etc.).

FIGS. 8-13 illustrate cross-sectionals views of some embodiments of a method of forming a deep trench capacitor within a trench comprising serrated sidewalls. It will be appreciated that elements in FIGS. 8-13 that have been described in previous embodiments have been designated with the same reference numbers for ease of understanding. While the cross-sectional-views shown in FIGS. 8-13 are described with reference to a method of forming a deep trench capacitor, it will be appreciated that the structures shown in the figures are not limited to the method of formation but rather may stand alone separate of the method.

Figure 8:
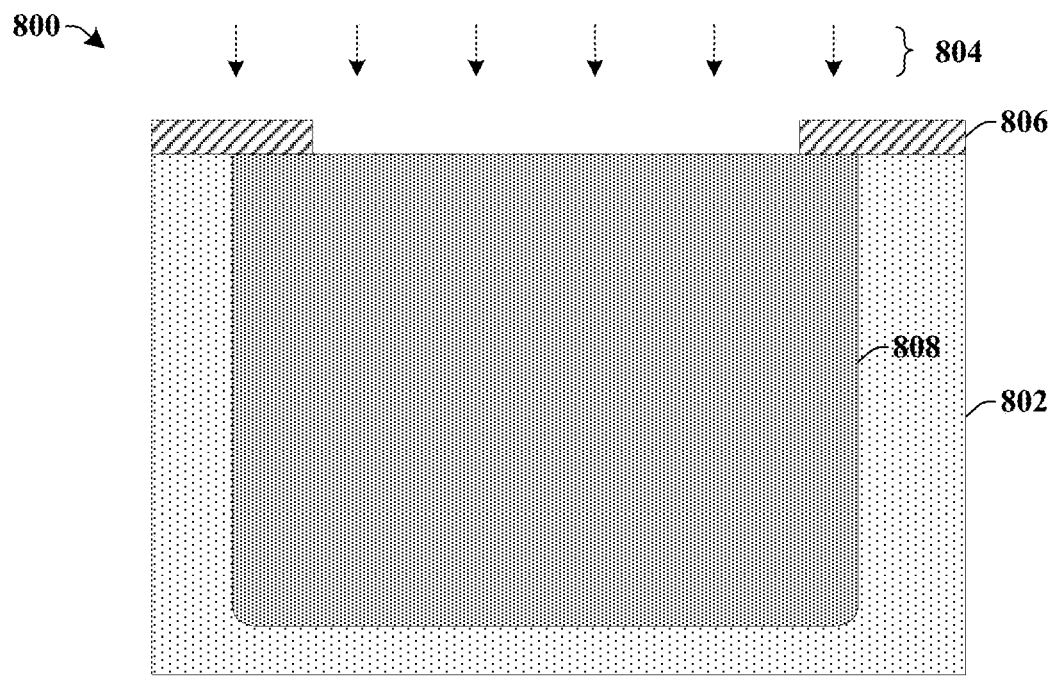
FIGS. 8-13 illustrate cross-sectional views of some additional embodiments of a method of forming a deep trench capacitor within a trench having serrated sidewalls.

As shown in cross-sectional view 800 of FIG. 8, a conductive doped region 808 may be formed within a substrate 802. In various embodiments, the substrate 802 may be any type of semiconductor body (e.g., silicon, SiGe, SOI) such as a semiconductor wafer and/or one or more die on a wafer, as well as any other type of semiconductor and/or epitaxial layers associated therewith. In some embodiments, the conductive doped region 808 may be formed by an implantation process that selectively implants the substrate 802 with a dopant species 804 (e.g., boron, phosphorous, arsenic, etc.). In some embodiments, the substrate 802 may be selectively implanted according to a first masking layer 806 (e.g., a photoresist layer, a hard mask layer, etc.). In some embodiments, after the implantation process is completed, the dopant species 804 may be driven into the substrate 802 by a high temperature thermal anneal.

Figure 9:
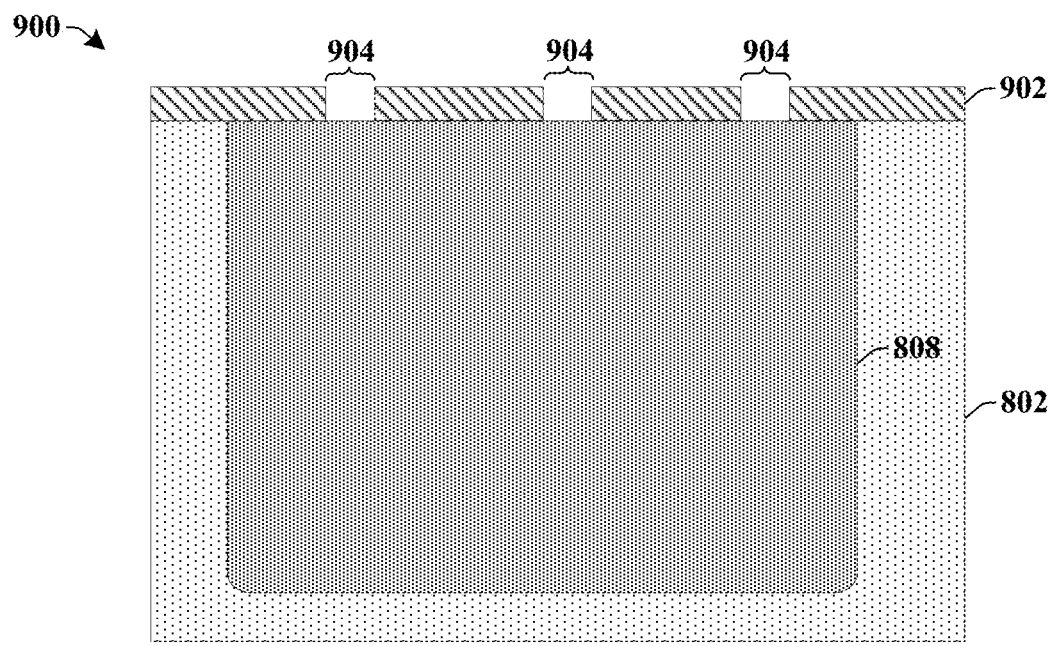

As shown in cross-sectional view 900 of FIG. 9, a second masking layer 902 is formed over the substrate 802. The second masking layer 902 may have one or more openings 904 corresponding to trenches that are to be subsequently formed in the substrate 802. In some embodiments, the one or more openings 904 may overlie the conductive doped region 808. In other embodiments, the one or more openings 904 may not overlie a conductive doped region. In some embodiments, the second masking layer 902 may comprise a hardmask layer. In some embodiments, the hardmask layer may comprise a nitride, an oxide, titanium, aluminum, tantalum, zirconium, hafnium, or some combination thereof, for example.

Figure 10:
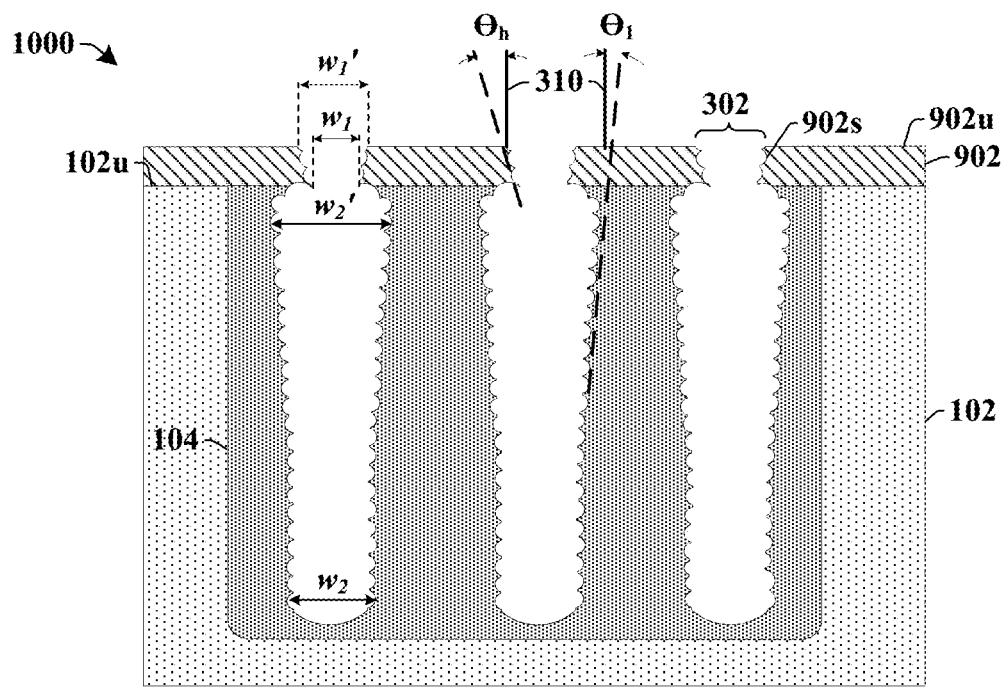

As shown in cross-sectional view 1000 of FIG. 10, one or more trenches 302 are formed within an upper surface 102u of the substrate 102. The one or more trenches 302 may be formed by selectively etching the substrate 102 with a multi-step etching process. The one or more trenches 302 each define an opening arranged along an upper surface 102u of the substrate 102 and an underlying cavity. The cavity has a width that extends between opposing sidewalls, and which generally increases (e.g., $w_2$ to $w_2'$) from as a distance from the upper surface 102u of the substrate 102 decreases. In some embodiments, the one or more trenches 302 curve inward along tops of the one or more trenches 302, so that the opening has a first width $w_1$, while the underlying cavity has a second width, $w_2$ or $w_2'$, that is larger than the first width $w_1$.

The second masking layer 902 comprises serrated sidewall 902s defining a plurality of curved depressions. Openings within the second masking layer 902 have widths extending between opposing serrated sidewall 902s. The widths of the openings generally increase as a distance from an upper surface 902u of the second masking layer 902 decreases. For example, while the width of the openings in the second masking layer 902 may vary due to the plurality of curved depressions, the width generally increases from a width $w_1$ to a width $w_1'$ at an overlying position. In some embodiments, the width of the one or more trenches 302 is greater than the width of the openings within the second masking layer 902 along an interface between the substrate 102 and the second masking layer 902.

In some embodiments, the serrated sidewalls 902s may be oriented at a non-zero angle $\Theta_h$ with respect to a normal line 310 perpendicular to the upper surface 102u of the substrate 102. The one or more trenches 302 comprise serrated sidewalls that are oriented at a non-zero angle $\Theta_1$ with respect to the normal line 310. In some embodiments, the non-zero angle $\Theta_h$ is larger than the second non-zero angle $\Theta_1$. In some embodiments, the slope of the opposing sidewalls of the one or more trenches 302 may increase (decreasing angle $\Theta_1$ with respect to normal line 310) as a distance from the upper surface 102u of the substrate increases.

In some embodiments, the multi-step etching process used to form the plurality of trenches 302 may comprise a multi-step dry etch process. The multi-step dry etch process comprises a plurality of cycles that respectively perform steps of exposing the substrate to an etchant to form a curved depression within the substrate and then subsequently forming a protective layer on the substrate. Each of the plurality of cycles forms a curved depression within a sidewall of the substrate 102. For example, a first cycle forms a first curved depression within a sidewall, a second cycle forms a second curved depression within the sidewall underlying the first curved depression, etc. In some embodiments, the etchant may comprise a dry etchant using an etching chemistry comprising tetrafluoromethane ($CF_4$), sulfur hexafluoride ($SF_6$), and/or nitrogen trifluoride ($NF_3$), for example. In some embodiments, the protective layer may be formed by exposing the substrate to a polymer gas (e.g., $C_4F_8$). In some embodiments, within a cycle a first gas may be introduced into a processing chamber to perform an etch during a first time period, the processing chamber may be purged, and then a second gas species may be in-situ (i.e., without breaking a vacuum) introduced into the process chamber to form a protective layer during a subsequent time period.

In some embodiments, the second masking layer 902 may be removed after the multi-step etching process is completed. In other embodiments (not shown), the second masking layer 902 may be left in place after the multi-step etching process is completed. In such embodiments, additional layers (e.g., layers of conductive material, layers of dielectric material, ILD layers, etc.) may be subsequently formed over the second masking layer 902.

Figure 11:
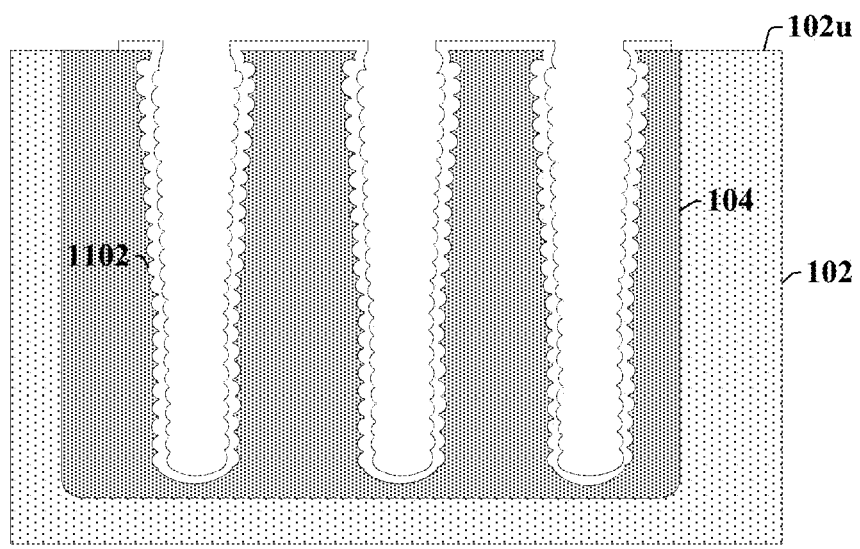

As shown in cross-sectional view 1100 of FIG. 11, a layer of dielectric material 1102 is conformally formed along the serrated sidewalls of the one or more trenches 302. Because the layer of dielectric material 1102 is conformally formed along the serrated sidewalls, the layer of dielectric material 1102 also has serrated sidewalls. In various embodiments, the layer of dielectric material 304 may comprise an oxide or a nitride, for example. In some embodiments, the layer of dielectric material 1102 may be formed using a deposition process such as a physical vapor deposition (PVD) process, a chemical vapor deposition (CVD) process, a plasma enhanced chemical vapor deposition (PE-CVD) process, an atomic layer deposition (ALD) process, etc. In other embodiments, the layer of dielectric material 1102 may be formed using a thermal process.

In some embodiments, the layer of dielectric material 1102 may also be formed along an upper surface 102u of the substrate 102. In some such embodiments, an etching process may be used to pattern the layer of dielectric material 1102 over the substrate 102. The etching process may comprise forming a masking layer (e.g., a patterned photoresist layer formed using a photolithography process) and then etching the layer of dielectric material 1102 using the masking layer. In some additional embodiments, a planarization process may be performed on the layer of dielectric material 1102 after the deposition is completed. In some embodiments, the planarization process may comprise a chemical mechanical polishing (CMP) process.

Figure 12:
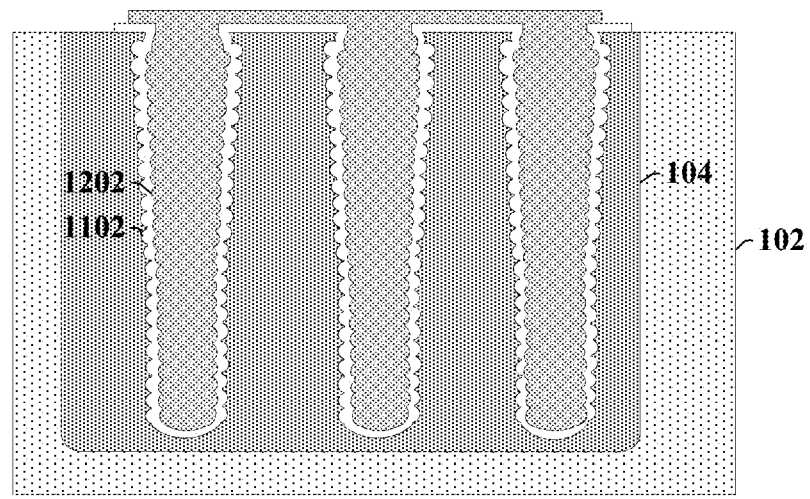

As shown in cross-sectional view 1200 of FIG. 12, a layer of conductive material 1202 is conformally formed along the serrated sidewalls of the layer of dielectric material 1102. Because the layer of conductive material 1202 is conformally formed along the serrated sidewalls of the layer of dielectric material 1102, the layer of conductive material 1202 also has serrated sidewalls. In various embodiments, the layer of conductive material 1202 may comprise a metal such as copper, aluminum, tungsten, etc. In other embodiments, the layer of conductive material 1202 may comprise doped polysilicon. In some embodiments, the layer of conductive material 1202 may be formed using a deposition process (e.g., PE-CVD, CVD, PVD, ALD, etc.) and/or a plating process (e.g., electroplating, electro-less plating, etc.).

In some embodiments, the layer of conductive material 1202 may also be formed over upper surfaces of the substrate 102 and the layer of dielectric material 1102. In some such embodiments, an etching process may be used to pattern the layer of conductive material 1202. In some additional embodiments, a planarization process (e.g., a CMP process) may be performed on the layer of conductive material 1202 after the deposition is completed.

Figure 13:
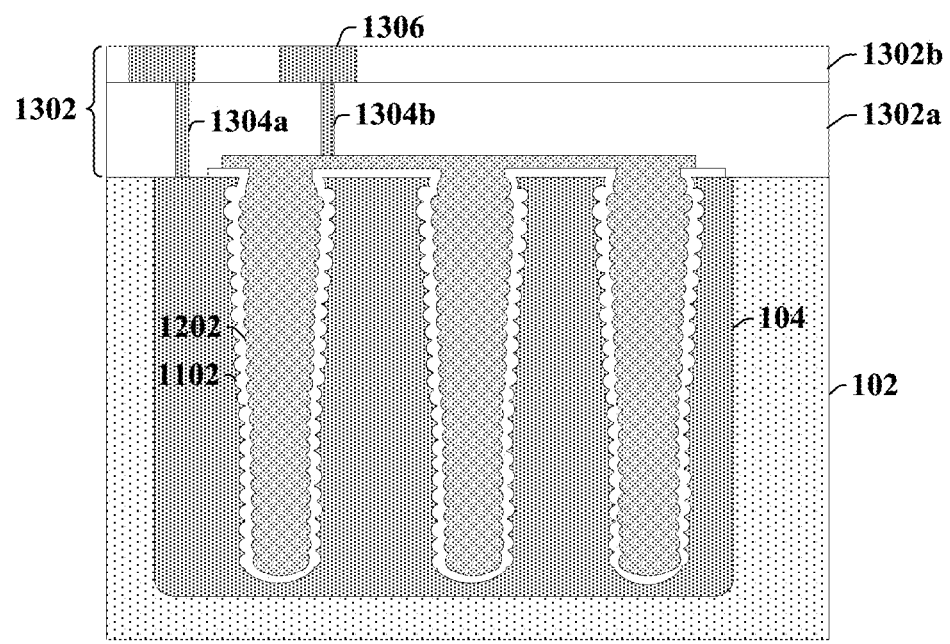

As shown in cross-sectional view 1300 of FIG. 13, a plurality of conductive contacts 1304a-1304b are formed within a dielectric structure 1302 overlying the substrate 102. In some embodiments, the plurality of conductive contacts 1304a-1304b may be formed by depositing a first inter-level dielectric (ILD) layer 1302a over the substrate 102. The first ILD layer 1302a is selectively etched to form contact holes. The contact holes are then filled with a conductive material (e.g., tungsten) to form the plurality of conductive contacts 1304a-1304b. A plurality of metal interconnect wires 1306 may be subsequently formed in a second ILD layer 1302b overlying the first ILD layer 1302a. In some embodiments, the first ILD layer 1302a may be deposited by a physical vapor deposition technique (e.g., PVD, CVD, PE-CVD, ALD, etc.). T In some embodiments, the plurality of conductive contacts 1304a-1304b may be formed using a deposition process and/or a plating process (e.g., electroplating, electro-less plating, etc.).

Figure 14:
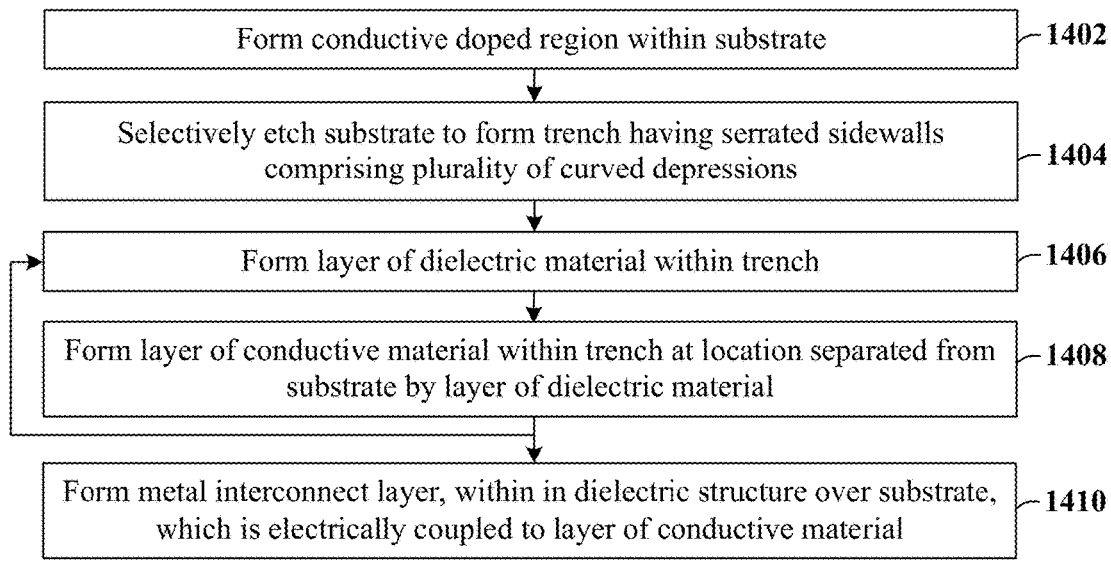
FIG. 14 illustrates a flow diagram of some embodiments of a method of forming a deep trench capacitor within a trench having serrated sidewalls.

FIG. 14 illustrates a flow diagram of some embodiments of a method 1400 of forming a deep trench capacitor with serrated sidewalls having a plurality of curved surfaces.

While method 1400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 1402, a conductive doped region may be formed in a substrate, in some embodiments. FIG. 8 illustrates some embodiments of a cross-sectional view 800 corresponding to act 1402.

At 1404, the substrate is selectively etched to form a trench having serrated interior surfaces with a scalloped profile defining plurality of curved depressions. In some embodiments, the serrated interior surfaces may comprise sidewalls defining a first plurality of consecutively connected curved depressions. In other embodiments, the serrated interior surfaces may comprise sidewalls defining a first plurality of discrete (i.e., non-consecutive) connected curved depressions. In some embodiments, the serrated interior surfaces may comprise a bottom surface connected between opposing sidewalls and defining a second plurality of curved depressions. FIGS. 9-10 illustrate some embodiments of cross-sectional views, 900 and 1000, corresponding to act 1404.

At 1406, a layer of dielectric material is formed within the trench. FIG. 11 illustrates some embodiments of a cross-sectional view 1100 corresponding to act 1406.

At 1408, a layer of conductive material is formed within the trench at a location separated from the substrate by the layer of dielectric material. The layer of conductive material is separated from the conductive doped region by way of the layer of dielectric material so as to form a deep trench capacitor within the trench. FIG. 12 illustrates some embodiments of a cross-sectional view 1200 corresponding to act 1408.

In some embodiments, acts 1406 and 1408 may be iteratively performed to form a plurality of alternating layers of dielectric material and conductive material. In some embodiments, the plurality of layers of dielectric material and/or conductive material may be a same dielectric material and/or conductive material, while in other embodiments the plurality of layers of dielectric material and/or conductive material may be different dielectric materials and/or conductive materials.

At 1410, a metal interconnect layer is formed in a dielectric structure over substrate. The metal interconnect layer is electrically coupled to one or more layers of the conductive material and/or the conductive doped region. FIG. 13 illustrates some embodiments of a cross-sectional view 1300 corresponding to act 1410.

Therefore, the present disclosure relates an integrated chip having a deep trench capacitor arranged within a trench comprising opposing serrated sidewalls having a plurality of curved surfaces.

In some embodiments, the present disclosure relates to an integrated chip. The integrated chip comprises a substrate having a trench with serrated sidewalls defining a plurality of curved depressions. A layer of dielectric material conformally lines the serrated sidewalls. A layer of conductive material is separated from the substrate by the layer of dielectric material and has sidewalls comprising a plurality of curved protrusions. The layer of dielectric material is configured as capacitor dielectric between a first electrode comprising the layer of conductive material and a second electrode arranged within the substrate.

In other embodiments, the present disclosure relates to an integrated chip. The integrated chip comprises a substrate having a trench comprising serrated interior surfaces, which extends from an upper surface of the substrate to an underlying position within the substrate. The trench defines an opening along the upper surface of the substrate and an underlying cavity having a larger width than the opening. A conductive doped region surrounds the trench. A layer of dielectric material conformally lines the serrated interior surfaces, and a layer of conductive material is arranged within the trench and is separated from the substrate by the layer of dielectric material.

In yet other embodiments, the present disclosure relates to a method of forming a deep trench capacitor. The method comprises selectively etching a substrate to form a trench having serrated interior surfaces defining a plurality of curved depressions. A layer of dielectric material is formed within the trench. The layer of dielectric material conformally lines the serrated interior surfaces. A layer of conductive material is formed within the trench and separated from the substrate by the layer of dielectric material. The layer of dielectric material is configured to act as a capacitor dielectric between a first electrode comprising the layer of conductive material and a second electrode arranged within the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a deep trench capacitor, comprising:
   implanting a dopant into an upper surface of a substrate to define a doped region extending from the upper surface of the substrate to within the substrate;
   selectively etching the upper surface of the substrate that is directly over the doped region to form a trench having serrated sidewalls defining a plurality of curved depressions, wherein the upper surface of the substrate intersects a curved depression of the plurality of curved depressions that faces a lower surface of the substrate defining a bottom of the trench, wherein the trench has a width extending between opposing sidewalls of the trench, the width increases as a distance from the upper surface of the substrate decreases;
   forming a dielectric material within the trench, wherein the dielectric material conformally lines the serrated sidewalls; and
   depositing a conductive material within the trench and separated from the substrate by the dielectric material, wherein the dielectric material is configured to act as a capacitor dielectric between a first electrode comprising the conductive material and a second electrode arranged within the substrate.

2. The method of claim 1,
   wherein the dielectric material continuously extends from within the trench to over the upper surface of the substrate, the dielectric material having an outermost sidewall that is directly over the doped region; and
   wherein the conductive material continuously extends from within the trench to an outermost sidewall that is directly over an upper surface of the dielectric material.

3. The method of claim 1, wherein selectively etching the upper surface of the substrate to form the trench comprises performing a multi-step etch process that comprises a plurality of cycles that respectively expose the substrate to an etchant to form one of the plurality of curved depressions and then subsequently form a protective layer on the one of the plurality of curved depressions.

4. The method of claim 1, further comprising:
   selectively etching the upper surface of the substrate that is directly over the doped region to form a second trench having second serrated sidewalls defining a second plurality of curved depressions, wherein the dielectric material continuously extends from within the trench, to directly over the upper surface of the substrate, and to within the second trench;
   wherein the dielectric material has an outermost sidewall that is directly over the doped region; and
   forming the conductive material directly over the dielectric material that is over the upper surface of the substrate.

5. The method of claim 1, wherein selectively etching the upper surface of the substrate to form the trench comprises performing a multi-step etch process comprising a plurality of cycles that respectively:
   introduce a first gas into a processing chamber to etch the substrate and to form one of the plurality of curved depressions within the substrate during a first time period;

purge the processing chamber during a second time period after the first time period; and introduce a second gas into the processing chamber, in-situ with the introduction of the first gas, to form a protective layer on the one of the plurality of curved depressions during a third time period that is after the second time period.

6. The method of claim 1, further comprising:

forming a hardmask layer over the upper surface of the substrate, wherein the hardmask layer has serrated sidewalls defining a third plurality of curved depressions, and wherein the substrate is selectively etched to form the trench according to the hardmask layer; and removing the hardmask layer prior to depositing the conductive material within the trench.

7. The method of claim 1, wherein surfaces of the substrate defining adjacent ones of the plurality of curved depressions along a first side of the trench meet at points; and wherein the points are arranged along a path that is angled at a non-zero angle with respect to a line that is normal to the upper surface of the substrate.

8. The method of claim 1, wherein the trench has a depth that is approximately equal to 19 microns.

9. The method of claim 1, further comprising:

forming a masking layer having sidewalls defining an opening over the upper surface of the substrate; and selectively etching the substrate according to the masking layer to form the trench, wherein selectively etching the substrate according to the masking layer increases a roughness of the sidewalls of the masking layer.

10. The method of claim 1, wherein a segment of the serrated sidewalls that meets the lower surface of the substrate is perpendicular to the upper surface of the substrate; and wherein the segment of the serrated sidewalls vertically extends from a first position below a sidewall of the conductive material to a second position that is directly laterally separated from the sidewall of the conductive material.

11. A method of forming a capacitor, comprising:

forming a masking layer having sidewalls defining an opening over a substrate;

selectively etching the substrate according to the masking layer to form a trench defined by sidewalls of the substrate having a first plurality of curved depressions wherein selectively etching the substrate according to the masking layer increases a roughness of the sidewalls of the masking layer;

forming a layer of dielectric material to conformally line the sidewalls and a lower surface of the substrate defining the trench; and forming a conductive material within the trench, the conductive material separated from the substrate by the layer of dielectric material.

12. The method of claim 11, further comprising:

removing the masking layer prior to forming the conductive material within the trench.

13. The method of claim 11, wherein increasing the roughness of the sidewalls of the masking layer defines a second plurality of curved depressions within the sidewalls of the masking layer.

14. The method of claim 11, wherein one or more of the first plurality of curved depressions are an arc having a central angle that extends through 180°; and wherein a line bisecting the arc also extends through the lower surface of the substrate.

15. The method of claim 11, wherein the lower surface of the substrate meets the sidewalls of the substrate defining the trench at points along a cross-section that are non-differentiable.

16. The method of claim 11, further comprising:

introducing a first gas into a processing chamber to perform an etch during a first time period;

purging the processing chamber during a second time period after introducing the first gas; and introducing a second gas in the processing chamber, in-situ with the first gas, to form a protective layer on the substrate during a third time period that is after the second time period.

17. A method of forming a capacitor, comprising:

forming a masking layer having sidewalls defining an opening over a substrate comprising a semiconductor material;

selectively etching the substrate according to the masking layer to form a trench defined by sidewalls of the substrate having a first plurality of curved depressions, wherein selectively etching the substrate according to the masking layer increases a roughness of the sidewalls of the masking layer and wherein the masking layer directly overlies the trench after selectively etching the substrate;

forming a layer of dielectric material to conformally line the sidewalls and a lower surface of the substrate defining the trench; and forming a conductive material within the trench, the conductive material separated from the substrate by the layer of dielectric material.

18. The method of claim 17, further comprising:

selectively etching the substrate according to the masking layer to form a second trench defined by second sidewalls of the substrate having a second plurality of curved depressions.

19. The method of claim 18, wherein the layer of dielectric material is formed to continuously extend from within the first trench to within the second trench.

20. The method of claim 17, wherein the masking layer comprises an oxide or a nitride.

* * * * *